(12) United States Patent
Hsu et al.

(10) Patent No.: US 12,578,657 B2
(45) Date of Patent: Mar. 17, 2026

(54) INTEGRATED COUPON DESIGN FOR SURFACE COATING QUALITY

(71) Applicant: TAIWAN SEMICONDUCTOR MANUFACTURING COMPANY, LTD., Hsinchu (TW)

(72) Inventors: Yu-Wei Hsu, Hsinchu (TW); Chien-Liang Chen, Hsinchu (TW); Shih-Tsung Chen, Hsinchu (TW); Chien-Yu Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 209 days.

(21) Appl. No.: 18/195,361

(22) Filed: May 9, 2023

(65) Prior Publication Data

US 2024/0377759 A1      Nov. 14, 2024

(51) Int. Cl.
*G03F 7/00*          (2006.01)

(52) U.S. Cl.
CPC .... *G03F 7/706845* (2023.05); *G03F 7/70608* (2013.01); *G03F 7/7065* (2013.01); *G03F 7/70033* (2013.01)

(58) Field of Classification Search
None
See application file for complete search history.

(56) References Cited

U.S. PATENT DOCUMENTS

| | | | |
|---|---|---|---|
| 10,244,624 B2 | 3/2019 | Michiwaki | |
| 11,287,737 B2 | 3/2022 | Van Zwol et al. | |
| 2004/0266158 A1 | 12/2004 | Boyle et al. | |
| 2017/0174905 A1* | 6/2017 | Bohling | .............. C09D 133/08 |

FOREIGN PATENT DOCUMENTS

| | | |
|---|---|---|
| TW | 201142975 A | 12/2011 |
| TW | 201708967 A | 3/2017 |
| TW | I776984 B | 9/2022 |

OTHER PUBLICATIONS

"Make Identical Project Parts with Router Templates—Wood magazine". Wood magazine. (2016, last viewed Jun. 16, 2025) (Year: 2016).*
Garage Fab. "How to Make Identical Duplicate Parts with a Grinder! Mighty Max Ep. 11". YouTube. Nov. 1, 2021. Last viewed Jul. 1, 2025. (Year: 2021).*
"What is Roughness Average?".ASTROPAK. <<https://astropak.com/surface-roughness-average-ra/#:~:text=%231%20Finish%20(Hot%20Rolled%2C,as%20the%20application%20of%20abrasives>>, Jul. 14, 2020, last viewed Jul. 1, 2025. (Year: 2020).*

(Continued)

*Primary Examiner* — Alexander M Weddle
(74) *Attorney, Agent, or Firm* — STUDEBAKER BRACKETT PLLC

(57)          ABSTRACT

To improve quality assurance and durability of coated components, a multifaceted inspection coupon is provided that includes opposing flat surfaces, separated by sides which include one or more curves or fillets representing surfaces of the coated components to be inspected. The inspection coupon is coated on all sides in the same manner as the components to be inspected, whereby later analysis of the coupon provides quality assurance of all coated surfaces of the components at once.

20 Claims, 12 Drawing Sheets

(56)    References Cited

OTHER PUBLICATIONS

"Understanding Grinding Fluid". Canadian Metalworking. <<https://www.canadianmetalworking.com/ canadianmetalworking/article/metalworking/understanding-grinding-fluid>>, Oct. 25, 2011, last viewed Jul. 1, 2025. (Year: 2011).*

Cowan, R. "Cutting Thin Aluminum on CNC Routers". YouTube. Mar. 5, 2023. (Year: 2023).*

"How to Make a Zero-Clearance Insert for Your Table Saw (Part 1)". Woodsmith. YouTube. Nov. 20, 2017, last viewed, Apr. 8, 2025). (Year: 2017).*

Heintz, T. "How to use Cad, 3D scanning, & SendCutSend for automotive fabrication". YouTube. Mar. 31, 2023, (last viewed, Apr. 9, 2025). (Year: 2023).*

Wolf Ridge Woodworking. "This DIY CNC can cut wood and aluminum and it cost less than you might think". YouTube. Feb. 24, 2023, last viewed Apr. 9, 2005. (Year: 2023).*

* cited by examiner

FIG. 4A                    FIG. 4B

INTEGRATED COUPON DESIGN FOR SURFACE COATING QUALITY

BACKGROUND

One growing technique for semiconductor manufacturing is extreme ultraviolet (EUV) lithography. EUV employs scanners using light in the EUV spectrum of electromagnetic radiation, including wavelengths from about one nanometer (nm) to about one hundred nm.

EUV lithography employs a laser-produced plasma (LPP), which emits EUV light. The LPP is produced by focusing a high-power laser beam, from a carbon dioxide ($CO_2$) laser and the like, onto a metal target, such as tin (Sn), in order to transition it into a highly ionized plasma state. This LPP emits EUV light with a peak maximum emission of about 13.5 nm or smaller. The EUV light is then collected by a collector and reflected by optics towards a lithography exposure object, such as a semiconductor wafer. Coated tools and components of an EUV lithography system must be properly coated in order to withstand LPP exposure, ionized environments and high temperatures.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
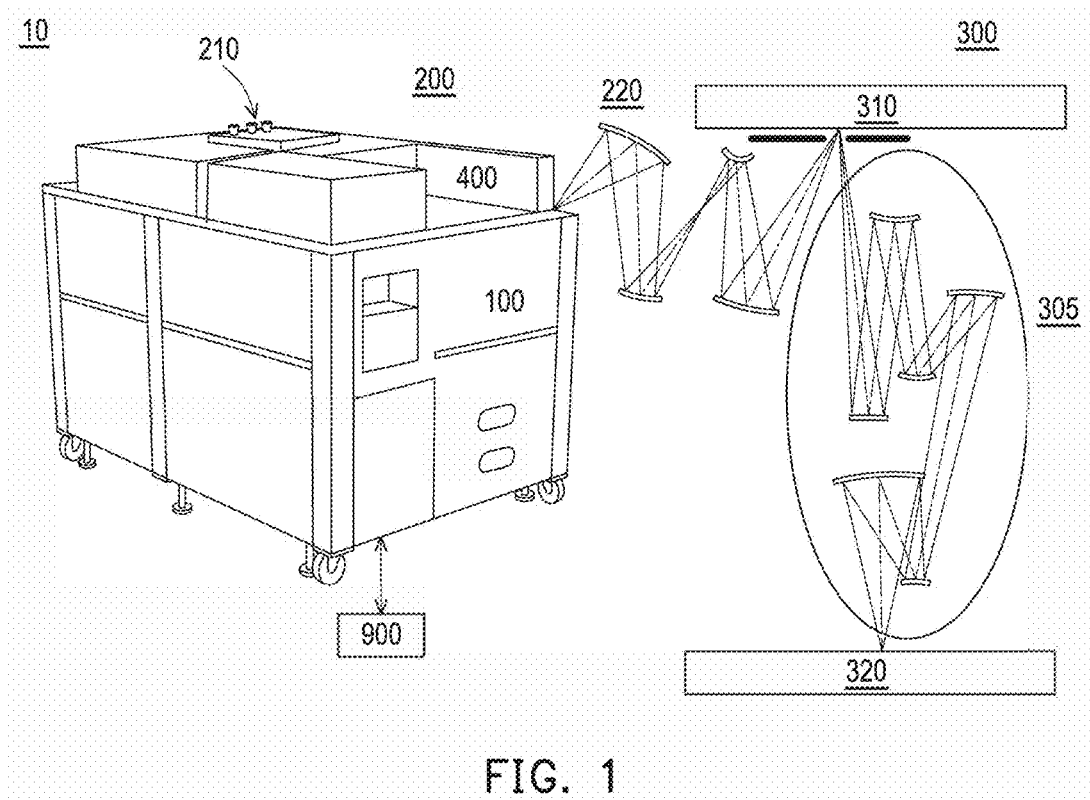
FIG. 1 is a schematic view of a lithography apparatus in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gratings, transmission fibers, etalons, diffusers, homogenizers, detectors and other instrument components, apertures, axicons and mirrors, including multi-layer mirrors, near-normal incidence mirrors, grazing incidence mirrors, specular reflectors, diffuse reflectors and combinations thereof. Moreover, unless otherwise specified, the term "optic," as used herein, is not meant to be limited to components which operate solely within one or more specific wavelength range(s) such as at the EUV output light wavelength, the irradiation laser wavelength, a wavelength suitable for metrology or any other specific wavelength.

In various embodiments, the semiconductor substrate is a semiconductor wafer, such as a silicon wafer or other type of wafer to be patterned. The semiconductor substrate is coated with a resist layer sensitive to the EUV light in the present embodiment. Various components including those described above and herein are integrated together and are operable to perform various lithography exposing processes. The lithography system may further include other modules or be integrated with (or be coupled with) other modules.

A lithography system is essentially a light projection system. Light is projected through a mask or reticle that constitutes a blueprint of the pattern that will be printed on a workpiece. The blueprint is four times larger than the intended pattern on such wafer or chip. With the pattern encoded in the light, the system's optics shrink and focus the pattern onto a silicon wafer coated with a photoresist, in some embodiments. After the pattern is printed, the system moves the wafer slightly and makes another copy on the wafer. This process is repeated until the wafer is covered in patterns, completing one layer of the eventual semiconductor device. In some embodiments, the semiconductor device includes a fin field effect transistor (FinFETs), a gate all-around FET (GAA FET), and/or other MOS transistor, together with capacitors, resistances and/or other electronic elements. To make an entire microchip, this process will be repeated one hundred times or more, laying patterns on top of patterns. The size of the features to be printed varies depending on the layer, which means that different types of lithography systems may be used for different layers, from the latest-generation EUV systems for the smallest features to older deep ultraviolet (DUV) systems for the largest. Although various embodiments disclosed herein are described with respect to an EUV light generating apparatus used for semiconductor wafer lithography, it is readily apparent that other applications of the disclosed embodiments may include other systems that require EUV light without limitation, such as a precision metrology system.

FIG. 1 is a schematic and diagrammatic view of an EUV lithography system 10, which in some embodiments is a rotating target EUV lithography apparatus. The EUV lithography system 10 includes an EUV radiation source apparatus 100 (sometimes referred to herein as a "source side," in reference to it or one or more of its relevant parts) to generate EUV light, an exposure tool 300 (sometimes referred to herein as the "scanner side" in reference to it or one or more of its relevant parts), and an excitation laser source apparatus 200. In various embodiments, the EUV radiation source apparatus 100 and the exposure tool 300 are coupled to each other by a coupling mechanism, which transfers generated EUV light from the EUV radiation source apparatus 100 to the exposure tool 300 via suitable optics 220, such as reflective mirrors. The coupling mechanism includes a focusing unit (not shown) to focus the transferred EUV light in some embodiments.

The exposure tool 300 includes various reflective optic components, such as convex/convex/flat mirrors, a mask holding mechanism 310 including a mask stage (i.e., a "reticle stage"), and wafer holding mechanism 320 (i.e., a "wafer stage"). The EUV radiation generated by the EUV radiation source apparatus 100 is guided by the reflective optical components 305 onto a mask (not shown) secured on the reticle stage 310. In some embodiments, the distance from the source side 100 to the reticle stage 310 disposed in the scanner side is approximately 2 meters. In some embodiments, the reticle size is approximately 152 mm by 152 mm. In some embodiments, the EUV light patterned by the mask is used to process a wafer supported on wafer stage 320. In various embodiments, a local workstation 400 controls the laser source apparatus 200. In various embodiments, a controller 900 controls the EUV lithography system 10 and/or one or more of its components remotely as described herein.

In various embodiments, the EUV lithography system 10 is designed to expose a semiconductor wafer to EUV light (or EUV radiation) in order to pattern the same during manufacturing. In some embodiments, the wafer includes a material sensitive to the EUV light (e.g., photoresist). In various embodiments, the EUV lithography system 10 employs the EUV radiation source apparatus 100 to generate EUV light having a wavelength ranging between about 1 nanometer (nm) and about 100 nm. In one particular example, the EUV radiation source apparatus 100 generates EUV light with a wavelength centered at about 13.5 nm. In various embodiments, the EUV radiation source apparatus 100 utilizes LPP to generate the EUV radiation in various desired wavelengths. The LPP emits EUV radiation, which is collected by a collector that reflects and focuses the EUV radiation for a subsequent lithography exposing processes in the scanner side 300.

In various embodiments, the laser source apparatus 200 includes a crucible 210, which provides the target material for the laser, and within which the laser is at least partially disposed. In various embodiments, the target material is deposited within a target region on an interior wall of the crucible 210. As the target region is rotated to the laser's excitation zone, having a width between 30 μm and 100 μm, laser light is directed through windows or lenses (not shown) into a non-moving excitation zone to transform the target metal into a LPP. In some embodiments, the laser light is continuous during operation of the apparatus 10. In various embodiments, the laser light is pulsed and synchronized with the rotation of the target material within the crucible 210. When the laser light heats the target metal, a high-temperature LPP is generated. These functions will be described in more detail later below.

In various embodiments, the LPP generated by the laser light creates random physical debris, such as ions, gases and atoms of the target metal, along with the desired EUV light. Accordingly, in some embodiments, during operation of the apparatus 10, there is an undesirable accumulation of such debris for which EUV components must be suitably protected.

Figure 2A:
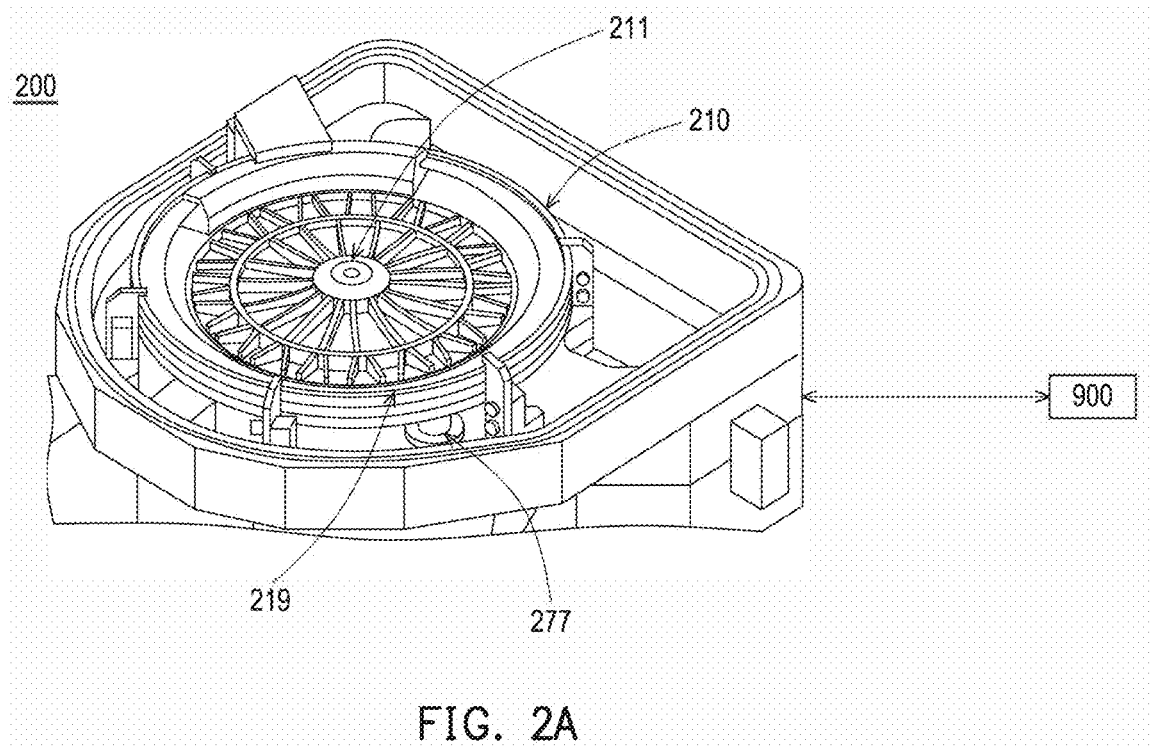
FIG. 2A is a perspective view of a crucible in accordance with some embodiments.

FIG. 2A is a perspective view of the crucible 210 used within the laser source apparatus 200 in accordance with various embodiments. In various embodiments, the crucible 210 is made of a metal, such as a stainless steel or a steel alloy. In some embodiments, the crucible 210 is made of other metals that are dissimilar from the target metal or metals used therewith. In some embodiments, the inner surface and various components of the crucible 210 are coated with a protective coating of a metal alloy or the like, such as an yttrium-based coating, to prevent degradation from exposure to a plasma environment. In various embodiments, the crucible 210 rotates around its center 211 during operation of the system 10. In some embodiments, the crucible rotates up to 25,000 rotations per minute (rpm), such as 19,920 rpm. In some embodiments, a motor 277 is provided to rotate the crucible 210. In various embodiments, the crucible 210 has an outer wall 219 having a cross-section that is substantially circular, however all embodiments are not so limited. In some embodiments, the rotation of the crucible 210 is controlled by the controller 900 as described later.

Figure 2B:
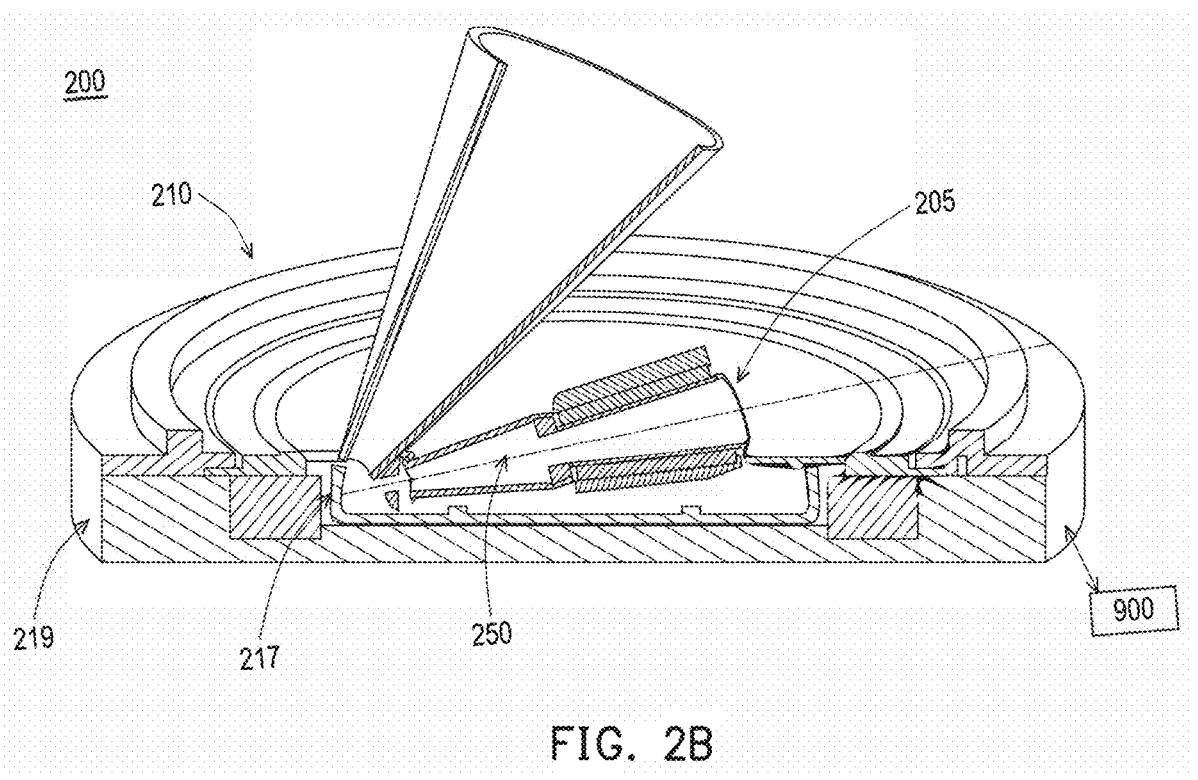
FIG. 2B is a further perspective view of a crucible in accordance with some embodiments.
Figure 3:
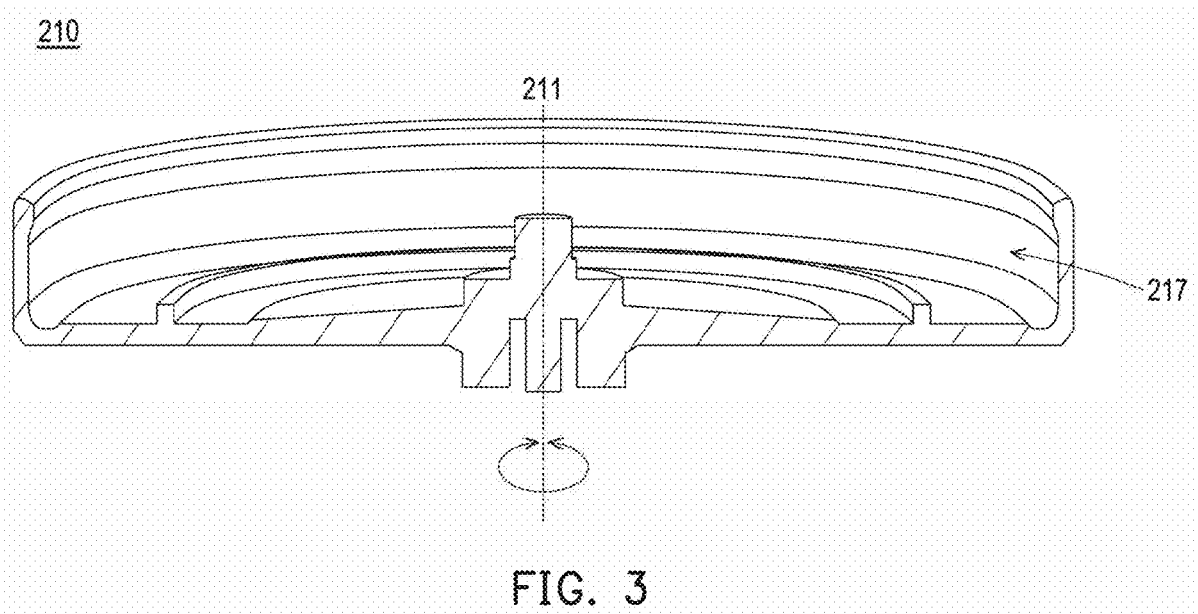
FIG. 3 is a side view of a crucible in accordance with some embodiments.

FIG. 2B is a further perspective view of the crucible 210 in accordance with various embodiments. FIG. 3 is a side view of the crucible 210 in accordance with some embodiments. In various embodiments, a target metal is disposed within a target region 217 on at least a portion of an interior of the wall 219 of the crucible 210. In some embodiments, the target region 217 is a continuous band disposed radially or circumferentially around the entirety of the interior of the wall 219. In some embodiments, the target region 217 is between 10 and 100 mm wide. In some embodiments, the target region 217 is disposed such that it includes the midpoint of the wall 219. In some embodiments, no portion of the target region 217 is disposed at the top of the wall 219 or at the bottom of the wall 219.

The EUV excitation laser source apparatus 210 uses a substantially stationary laser 205 to superheat a target metal disposed within the target region 217 as the crucible 210 rotates at high speed. In some embodiments, the laser light 250 is substantially continuous during operation of the apparatus 10. In other embodiments, the laser light 250 is pulsed. In some embodiments, the target metal is a tin (Sn), a tin alloy or other useful metal.

Various other types of EUV lithography systems are readily contemplated to be used with the methods and apparatus described herein. In addition, this disclosure is readily useful for quality control of any coated components and surfaces including those used in plasma chambers or other types of equipment generating extreme environments.

In various semiconductor process chambers, such as plasma etching chamber and plasma CVD chambers for example, metal oxide-based coatings are often used to protect the surfaces of such process chambers and their components. Yttrium-based coatings are widely used, but are also prone to voids and spalling forming on the surface and corners of parts, resulting in defects that affect wafer quality, which in turn affects wafer acceptance tests (WAT), circuit or chip probe (CP) yields and, therefore, impact manufacturing costs.

In various embodiments, a plasma-resistant coating is a non-thermal sprayed coating. It has been found that improper plasma spray coatings will contaminate substrates processed in a plasma chamber. For example, yttrium (Y) contamination has been found on substrates subsequent to plasma processing in a chamber having components with a plasma sprayed yttria ($Y_2O_3$) coating. In various instances, the sprayed coatings have a high density of cracks and voids throughout the thickness of the coating. Typical plasma sprayed coatings have a porosity of 3% or more. Plasma sprayed coatings surfaces are also characteristically rough with a typical arithmetic roughness average ($R_a$) being on the order of 5 micrometers ($\mu m$). Because cracks, voids and particulates are unevenly eroded during plasma exposure, a plasma-spray coated component develops a rough plasma etched surface having particles up to 25 $\mu m$ in diameter. Formation of such large surface particles may result from preferential erosion along grain or particle boundaries where the film stress is relatively high and the bonding strength relatively low. Rough peaks found on plasma etched coatings indicate such particles eventually break off and potentially contaminate substrates processed in the chamber. Substrate contamination, plasma process drift and component surface deterioration have therefore been correlated to the cracks, voids, rough surfaces and large particulates present in a plasma sprayed coating. Notably, a similar evaluation of process chamber components formed from bulk ceramic (e.g., bulk yttria) also identified numerous voids having a diameter of 25 $\mu m$ or more. As such, bulk ceramics provide little improvement in plasma resistance over plasma sprayed varieties.

Yttrium-based coatings, such as $Y_2O_3$ coatings, have been used in plasma process tools as a coating material due to its high resistance to erosion and corrosion, especially in metal or gate etch processes which involve $NF_3$, $Cl_2/O_2$ or $HBr/O_2$ plasmas. However, in some processes, particles originating from $Y_2O_3$ coatings are increasingly problematic, especially as the lines and structures of manufactured semiconductor devices become smaller and smaller. Such particles cause device and process failure. In some instances, a $YF_3$ coating is used instead of $Y_2O_3$ in an attempt to suppress the generation of contaminant particles. However, the etch rate drifts or decreases significantly with fresh or cleaned parts, and extended dummy runs are required to season the parts in order to have an acceptable and stable etch rate. Contamination is also generated from unexpected sources in many embodiments.

A Wafer Acceptance Test (WAT) is performed, in various embodiments, to analyze the success of the wafer fabrication process at various stages of fabrication and attempt to determine the cause of any fabrication deficiencies. A CP (circuit probe) test involves using one or more probes to determine which die are good and which are not, in various instances. Proper quality control of the plasma sprayed coating process, and other similar processes, would reduce particle contamination and defect formation. This, in turn, improves performance of parts and components, as well as wafers and other workpieces manufactured therewith. The concomitant enhancement of WAT/CP results serves to reduce running costs across a semiconductor manufacturing facility.

In various cases, a certificate of analysis (CoA) is generated and provided with coated parts and components to demonstrate effective quality control to users and purchasers of the same. Inspection coupons (i.e., testing or monitoring pieces) ensure repeatability and reproducibility when performing laboratory testing. Such coupons help a user independently evaluate performance of a similarly coated part or component in a plasma chamber by measuring the mass loss, defects and particle generation of the coupons as the test progresses. In various instances, a flat, rectangular inspection coupon is separately coated on one face with the same lot of coating to be, or which has been, used for spray coating parts and components of lithography systems and plasma chambers. In some embodiments, the inspection coupon is spray coated at the same time, i.e., simultaneously with, and in the same manner as the components, parts, or the like as they are coated. In such cases, this is accomplished by putting the inspection coupon on, in, or nearby the parts or components while they are being coated. In some embodiments, the rectangular coupon has a single continuous curved face to represent a curve on a surface of a part or component to be coated. In various instances, many varied inspection coupons must be generated and analyzed to provide all necessary CoAs representing a complex part or component with many surfaces and/or curvatures in its entirety, or a lot of such complex parts and components that were coated in the same process run using the same materials, conditions and techniques.

Traditional CoA techniques e.g., using standard analysis instruments (e.g., an optical profilometer and other electromagnetic spectrum analysis instruments), have limited performance parameters, namely, there is generally a trade-off between scan speed and resolution of the analysis of inspection coupons in various instances. Accordingly, speedier inspections entail lower resolution analysis, thereby leading to a lower confidence in the determined quality control parameters. This effect is multiplied based on the number of inspection coupons that are needed to represent an entirety of the parts and components. Therefore, to ensure equipment is operating under control, there is a need for an apparatus and a method for automatically performing quick and precise scanning of parts to monitor their surface conditions to improve the PM success rate and expand equipment/tool lifetimes.

An integrated (i.e., multi-faceted) inspection coupon is used herein in various instances in place of the inspection coupons described above, in order to more efficiently analyze the coating quality on various surfaces of a coated part or component at once. Such an integrated coupon combines two opposing faces (flat or singularly curved) and up to eight representative concave-convex surfaces in the sidewall and/or corners thereof (that respectively match up to eight curved sections of the part or component to be coated). The use of a single integrated coupon to represent a coated part or component in place of multiple single inspection coupons needed to represent the same meaningfully reduces analysis and materials costs as well as the time needed to perform effective quality control for coating of parts and component surfaces. Such single integrated inspection coupons allow for the analyses of multiple CoAs at once.

Figure 4:
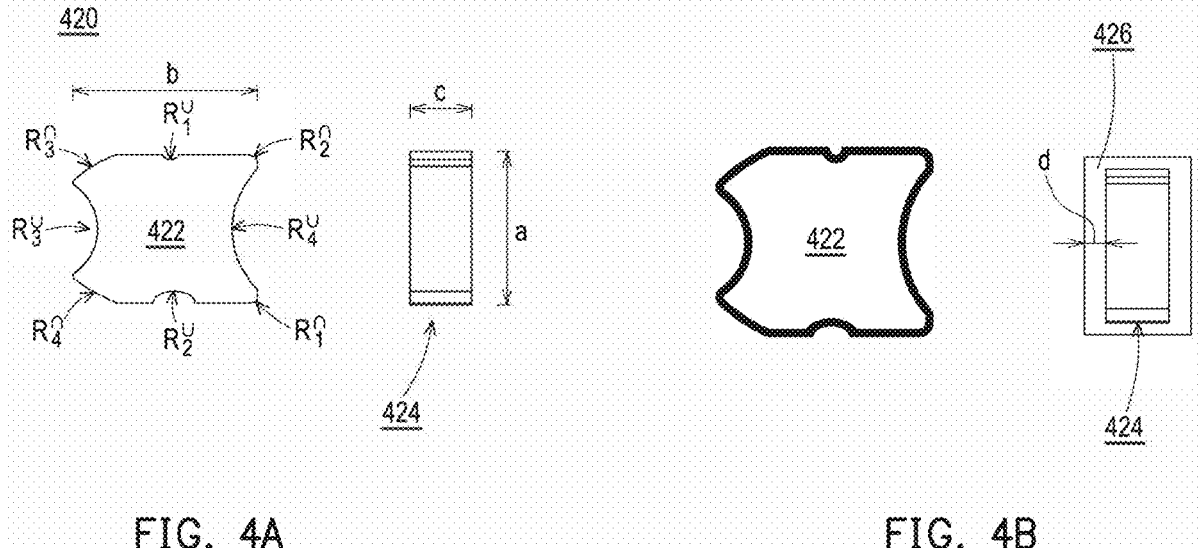
FIG. 4A shows a top and side view of an inspection coupon in accordance with some embodiments.
FIG. 4B shows a top and side view of a coated inspection coupon in accordance with some embodiments.

FIG. 4A shows a top and side view of an integrated inspection coupon 420 in accordance with various embodiments. In some embodiments, the integrated inspection coupon includes a pair of opposing faces 422 and a circumferential sidewall 424 disposed continuously therebetween. In some instances, the integrated inspection coupon 420 is solid. In other instances, the integrated inspection coupon is hollow. In various embodiments, the integrated inspection coupon 420 is made of a material including but not limited to a metal, a ceramic or an alloy. In various instances, the material has a roughness average ($R_a$) of between 2 and 12 μm. In some embodiments, the opposing faces 422 have a maximum length (see, e.g., element "a" in FIG. 4A) of between about 10 mm and about 200 mm. In some embodiments, the opposing faces 422 have a maximum width (see, e.g., element "b" in FIG. 4A) of between about 10 mm and about 200 mm. In various embodiments, the integrated inspection coupon 420 is envisioned as fitting within a virtual rectangle of length "a" and width "b." However, in various embodiments described herein, the sidewall 424 is cut and curved or otherwise formed to match various curvatures of a part or component to be coated, and in such embodiments may not therefor remain rectangular. In such cases, any reference herein to a "side" of the integrated inspection coupon 420 or one of its faces 422, means somewhere along a section of the length "a" and width "b" not substantially near a junction or corner of the length "a" and the width "b" of a virtual rectangle that best fits the integrated inspection coupon 420, and any reference to a "corner" or "junction" means at or substantially near any of the four intersections of length "a" and width "b" of such virtual rectangle, unless otherwise indicated herein.

In various embodiments, each of the opposing faces 422 are flat. In other instances, each of the opposing faces 422 are arced and include one or more curved sections. In some instances, one of the opposing faces 422 is flat while the other is not. In some embodiments, each of the opposing faces 422 are parallel to each other. In other instances, the opposing faces 422 have surfaces or forms that are dissimilar from each other. In various embodiments, a flat face 422 can represent a flat extent of a part or component to be coated. Accordingly, it is not necessary to coat both opposing faces 422 for a CoA analysis in some embodiments, since one face 422 can represent all flat surfaces of the part or components.

The integrated inspection coupon 420 includes a continuous sidewall 424 disposed circumferentially between the opposing faces 422 in various embodiments. In some instances, the sidewall 424 has a maximum height (see, e.g., element "c" in FIG. 4A) of between about 10 mm and about 200 mm. Accordingly, in some embodiments, the total volume of the integrated inspection coupon 420 is between $10^3$ mm$^3$ and $8 \times 10^6$ mm$^3$.

In various embodiments, the sidewall 424 is shaped or formed in two or more sections thereof to include a curve or a curvature having a radius that matches one or more curves of the part or component to be coated. Accordingly, in such embodiments, the edges of the opposing faces 422 are curved in such sections. In such manner, the coating of the curved sections of the sidewall 424 represents the coating of the matching curvature of the part or component to be coated for a CoA in some embodiments. Furthermore, multiple such curved sections represent multiple respective curved sections of the part or component to be coated and, thus, provide the basis for multiple CoAs using a single integrated inspection coupon 420.

In some embodiments, the sidewall 424 includes a section having at least one convex curvature, representing one or more convex curvatures of like radius found on a part or component to be coated. In various embodiments, the sidewall 424 includes a plurality of sections of differing convex curvatures. In some embodiments, the sidewall 424 accommodates between one and sixteen convex curvatures on its various sides. In some embodiments, all convex curvatures are disposed exclusively on the sides of the integrated inspection coupon 420, and not at the corners thereof (not shown in the drawings).

In some embodiments, the sidewall 424 includes a section having at least one concave curvature, representing one or more concave curvatures of like radius found on a part or component to be coated. In various embodiments, the sidewall 424 includes a plurality of sections of differing concave curvatures. In some embodiments, the sidewall 424 accommodates between one and four concave curvatures on its various sides. In some embodiments, all concave curvatures are disposed exclusively on the corners of the integrated inspection coupon 420, and not on the sides thereof.

In various embodiments, the number of convex curvatures and concave curvatures ($R_n^\cap$ & $R_n^\cup$) is between one and twenty. In various instances, the radius of any convex curvatures is between about 0.1 and 100 mm. In various cases, the radius of any concave curvatures is between about 0.1 and 100 mm. In some embodiments, the ratio of concave curvature radii to convex curvature radii is between 0.8 and 1.2.

FIG. 4B shows a top and side view of an integrated inspection coupon 420 that is coated in accordance with various embodiments. In some embodiments, the integrated inspection coupon 420 is coated in accordance with the descriptions provided below with respect to FIG. 5. In various embodiments, the coating 426 has a porosity between about 0.1 and 10%. In various embodiments, the coating 426 has a Vickers hardness value ($H_v$) between 100 and 1000. It has been determined that these values of porosity and hardness are useful in providing durable metal oxide coatings (i.e., an yttrium-based coating) that are less subject to spalling, voids and other defect formations in a high temperature plasma environment in many instances. In various embodiments, the thickness d of the coating 426 is between 0.001 μm and 500 μm. In some instances, the coating 426 comprise a metal oxide, a fluoride, a nitride, a carbide or a combination of one or more of the same.

Figure 5:
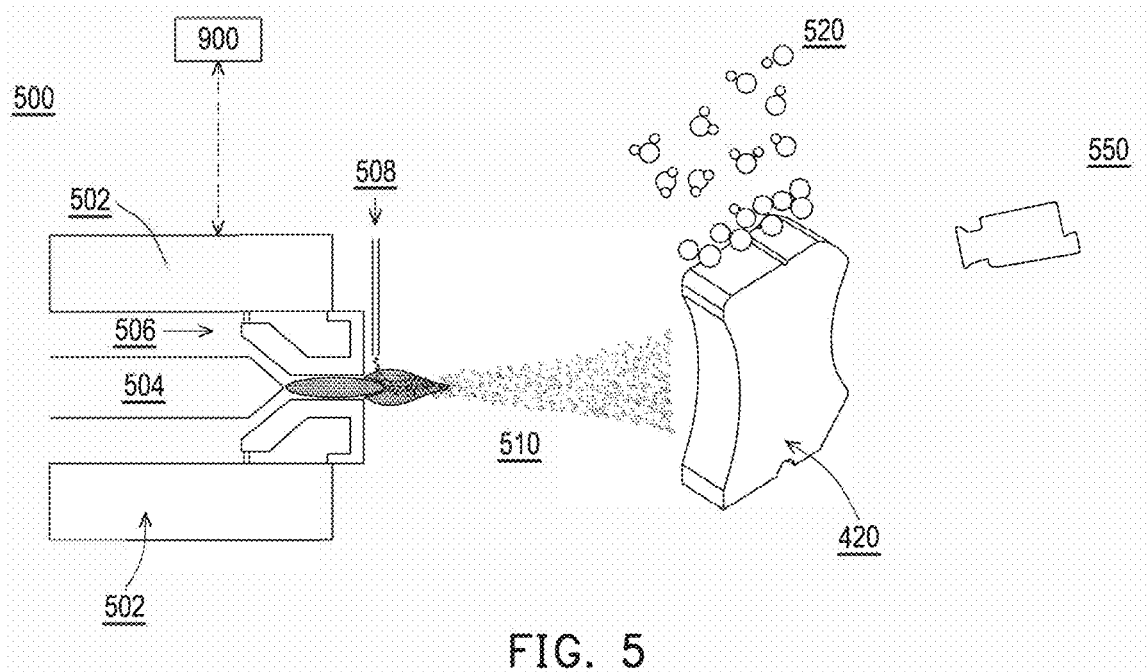
FIG. 5 illustrates the coating of an inspection coupon in accordance with some embodiments.

FIG. 5 illustrates a plasma spray coating apparatus 500 that performs a coating process for coating the integrated inspection coupon 420 in accordance with some embodiments. The plasma spray coating apparatus 500 includes one or more anodes 502, a cathode 504, a plasma gas inlet 506, and a powder injector 508 for generating a spray coating 510 that is applied to one or more faces or sections of sidewall or the entirety of the integrated inspection coupon 420. Plasma spray is a widely used process to deposit a large range of such coating materials. The material is supplied as powder, suspension, solution or liquid and injected into a stream of hot, highly ionized gas. The material thus melts or vaporizes in this hot plasma and is at the same time accelerated towards the substrate by the plasma stream. In some embodiments, the spray coating 510 is deposited using atmospheric plasma spraying (APS), suspension plasma spraying (SPS) or atmospheric deposition (AD). In some instances, low pressure plasma spraying (LPPS), vacuum plasma spraying (VPS), plasma spray physical vapor deposition (PS-PVD) or other similar process are likewise used for spray coating deposition. In further instances, a second coating 520 may be applied in place of or in addition to a first coating 510 using physical vapor deposition (PVD), chemical vapor deposition (CVD) and atomic layered deposition (ALD). In various embodiments, the plasma spray coating apparatus 500 applies any coatings to the integrated inspection coupon 420 in the same manner as a part or component to be inspected. In various embodiments, the plasma spray coating apparatus 500 is controlled by the controller 900 described below with respect to FIG. 9. In some embodiments, the integrated inspection coupon 420 is inspected by an analysis instrument 550 after coating for producing multiple CoAs related to a part or component separately coated by the same process and materials (i.e., in the same lot), and the results and data therefrom are likewise provided to the controller 900.

Figure 6:
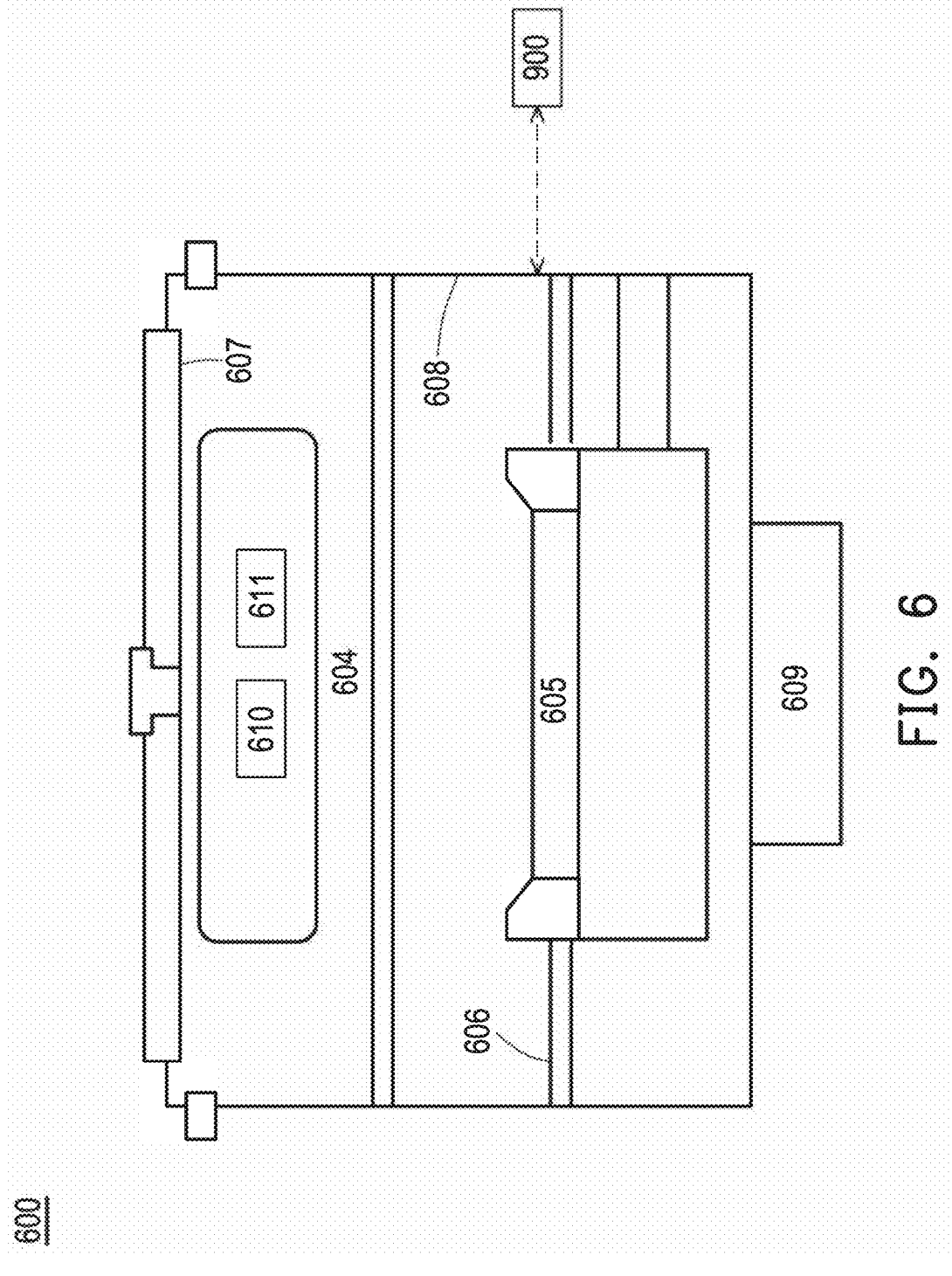
FIG. 6 shows the internal components of a plasma chamber in accordance with some embodiments.

While plasma resistant coatings may be used on parts, components and surfaces of the crucible 210 and other components of the EUV lithography system 100 that may be exposed to plasma and/or high-temperature environments, they are also useful in other types of similar equipment. FIG. 6 is a simplified cross-sectional view of the internal components of an exemplary plasma chamber 600, in accordance with various embodiments. In some embodiments, a semiconductor wafer or workpiece is positioned therein for etching by a plasma generated by a first direct current/ alternating current (DC/AC) radio frequency (RF) source (not shown). In some embodiments, the plasma chamber 600 includes a showerhead 604, an electrostatic chuck (ESC) 605, a liner 606, a plasma chamber top 607, a plasma chamber wall 608, a pump 609 and a plasma sheath 611 through which an etch gas 610 is provided. A gas inlet (not shown) is disposed through the chamber 600 and is used to deliver one or more processing gases to the processing volume therein from a processing gas source (not shown) that is in fluid communication therewith. In some embodiments, the gas is fed through the showerhead 604, which is configured to spray precursor gases supplied from an external precursor gas source into the processing volume.

The ESC 605 is commonly used in semiconductor device manufacturing operations where vacuum chucking is not feasible, and mechanical clamping is undesirable, such as supporting and securing a substrate in a low-pressure environment of a processing chamber 600. In some embodiments, the ESC 605 is formed of one or more layers of dielectric material (not shown) that provide a surface for supporting the wafer (e.g., a substrate-support surface) and further includes a chucking electrode (not shown) embedded in or disposed between the one or more layers of dielectric material. In some embodiments, the wafer is secured to the ESC 605 by providing a voltage potential difference between the substrate and the chucking electrode that results in an electrostatic attraction force therebetween.

Often, the ESC 605 is part of an assembly configured to control aspects of a plasma-assisted process performed within the processing chamber, such as a plasma-assisted etching process that uses ions to bombard a material surface of a substrate through openings in a mask layer formed on the substrate surface. In some embodiments of a plasma-assisted etching process, the wafer or substrate is positioned on the ESC 605, a plasma is formed over the substrate, and ions are accelerated from the plasma towards the substrate across a plasma sheath 611, i.e., a region depleted of electrons that formed between the plasma and the surface of the substrate.

In various embodiments, the liner 606 is installed in the plasma chamber 600 and configured to separate the chamber top 607 and/or the chamber wall 608 from a plasma processing volume or area, so as to prevent the damage due to plasma arcing and the like.

In various embodiments, the chamber wall 608 defines a plasma processing area or volume. The processing volume is fluidly coupled to one or more dedicated vacuum pumps 609, which maintain the processing volume at proper atmospheric pressure conditions and evacuate processing and/or other gases, therefrom.

In various embodiments, a plasma is formed over the wafer substrate using RF power, and ions are accelerated from the plasma towards the substrate across a plasma sheath 611. In some embodiments, the plasma sheath exhibits non-linear diode-like properties, which result in rectification of an applied RF field, such that a DC voltage drop, or self-bias, appears between the substrate and the plasma. In various embodiments, all the internal components and surfaces mentioned above for the plasma chamber 600 are coated and inspected according to the disclosures provided herein.

Figure 7:
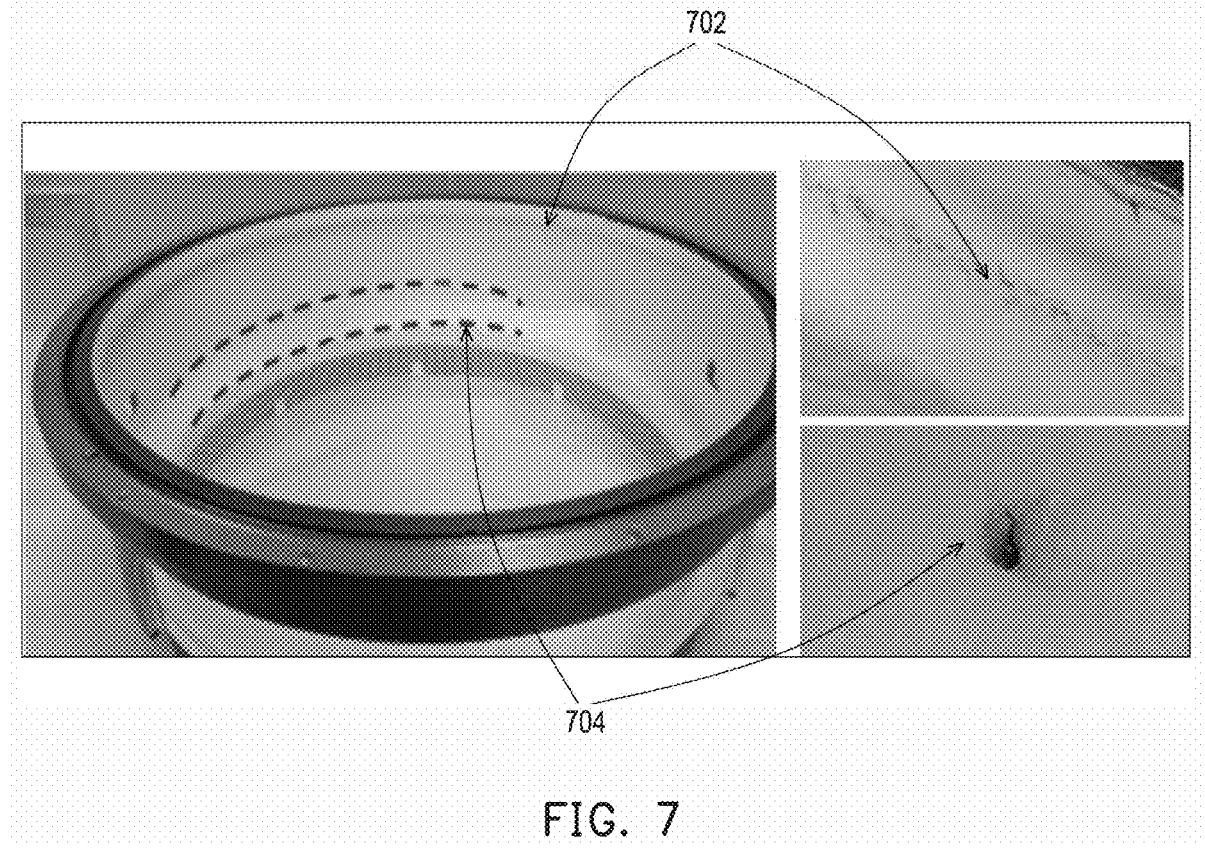
FIG. 7 shows defects in a plasma chamber arising from improperly coated components in accordance with some embodiments.

FIG. 7 shows defects in a sidewall arising from improperly coated components. The defects include, but are not limited to, instances of spalling 702 and voids 704. The analysis of the integrated inspection coupon 420 is meant to identify any concerns with coated parts and components to avoid such defects.

Figure 8A:
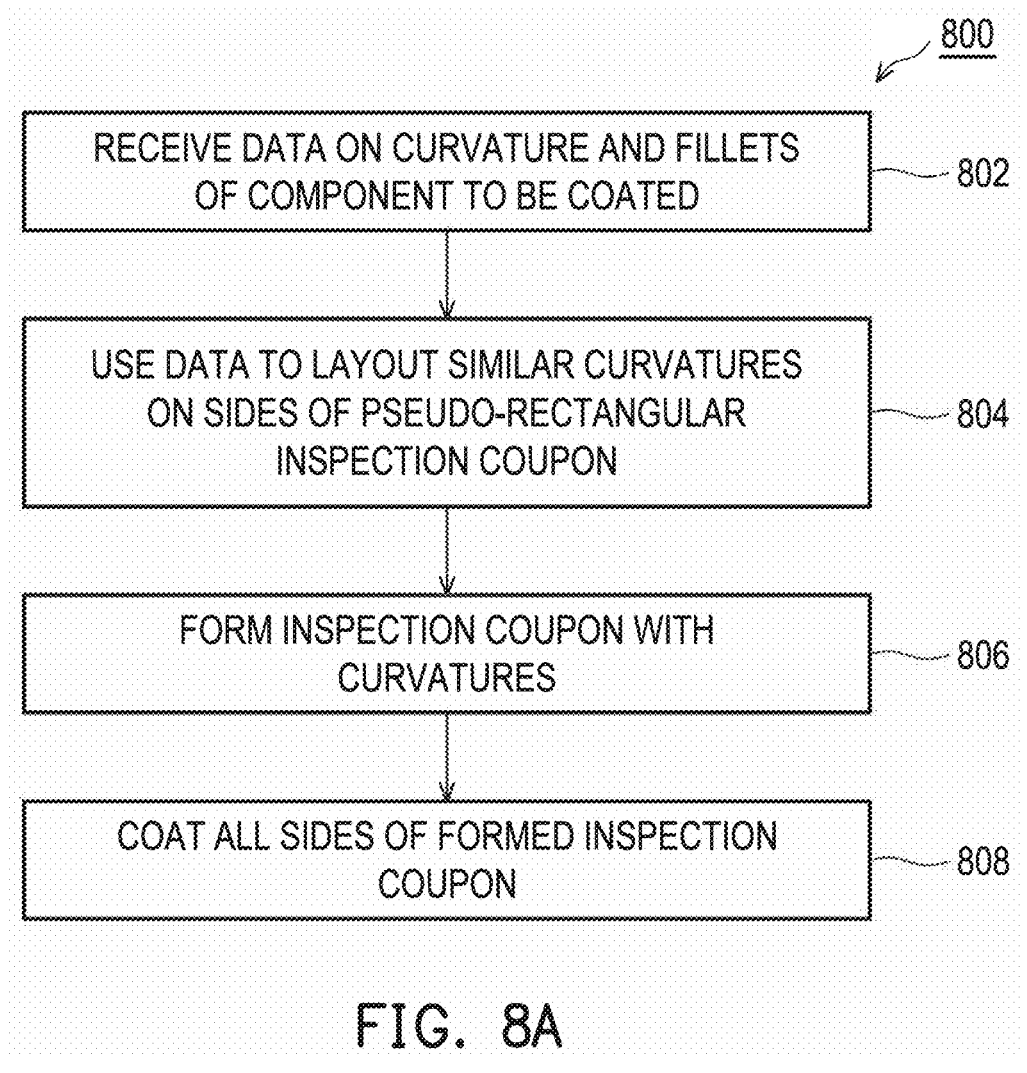
FIG. 8A is a process for manufacturing an inspection coupon in accordance with some embodiments.

FIG. 8A illustrates a process 800 for manufacturing an inspection coupon in accordance with various embodiments. In some embodiments, the process 800 is controlled by the controller 900.

In various instances, the process 800 for manufacturing an integrated inspection coupon 420, first includes receiving data on curvatures, curves, fillets and the like that appear on a part or component to be coated (operation 802). This can be performed by measuring the component with an optical, electromagnetic or physical analysis device, such as the analysis device 550.

In various instances, the data determined from operation 802 is used to map or layout similar curvatures with like radii on various sides or at various corners of the integrated inspection coupon 420 (operation 804). In some embodiments, any convex curvatures are mapped to sections exclusively on the sides of the integrated inspection coupon 420. In some embodiments, any concave curvatures are mapped exclusively to corners of the integrated inspection coupon 420. In various instances, the curvatures match based on having a similar radius.

After operation 804, the integrated inspection coupon 420 is formed having the measured curvatures of the part or component to be coated at the mapped location (operation 806). In some embodiments, the integrated inspection coupon is cut by a laser or other cutting device from a sheet of material. In such cases, any unused material from an initial generation of the integrated inspection coupon(s) 420 may be reclaimed and used to generate additional integrated inspection coupons. In other instances, the integrated inspection coupon may be formed from a molding having the measured curvatures.

Next, at operation 808, one or more faces 422 and sections of the sidewall of the integrated inspection coupon 420 are coated in a similar manner as the part or component to be coated. In some instances, the integrated inspection coupon 420 is coated at the same time as the coated parts or components, such as by placing the integrated inspection coupon 420 with or on such parts or components at the time of coating. In other cases, the integrated inspection coupon 420 is coated separately but uses the same lot of coating materials and equipment. In some instances, where the opposing faces 422 are flat, and therefor analysis of which is redundant, only one of the two faces 422 are coated for analysis, in order to save coating material costs and analysis time. In some embodiments, the integrated inspection coupon 420 is rotated to accomplish coating on multiple sides.

Figure 8B:
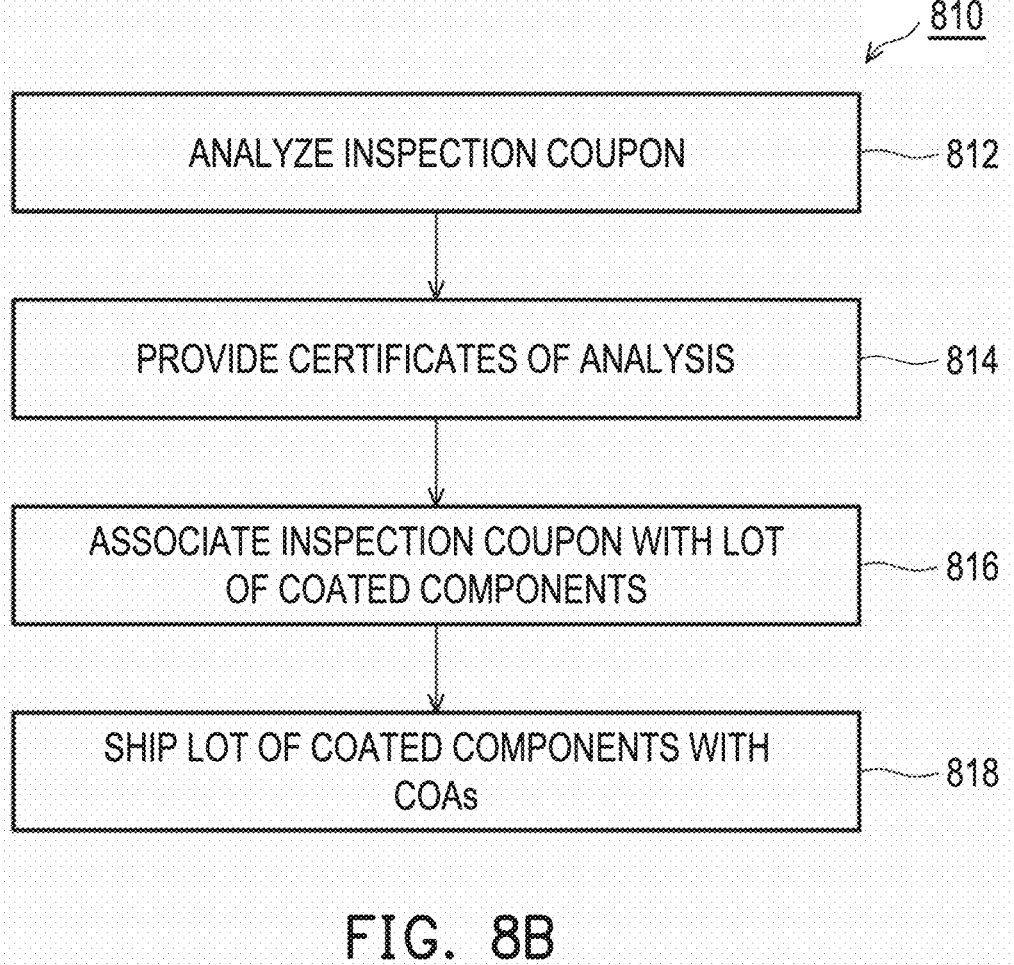
FIG. 8B is a process for coating an inspecting coupon in accordance with some embodiments.

FIG. 8B illustrates a process 810 for analyzing an inspection coupon in accordance with some embodiments. In some embodiments, the process 810 is controlled by the controller 900. Commencing with operation 812, the coating 426 applied to the integrated inspection coupon 420 on it various sides, faces and corners, is analyzed by the analysis device 550 to determine coating quality, based on hardness, roughness, uniform and thorough coating coverage and the like. Based on the analysis performed at operation 812 multiple certificates of analysis (CoAs) are generated, each corresponding to one of the faces or curvatures inspected (operation 814). Next, at operation 816, the integrated inspection coupon 420 is associated with one or more coated parts or components, or with lots of the coated parts and components. Finally, at operation 818, the coated parts or components are shipped to customers with the multiple CoAs generated from the integrated inspection coupon 420.

Figure 9A:
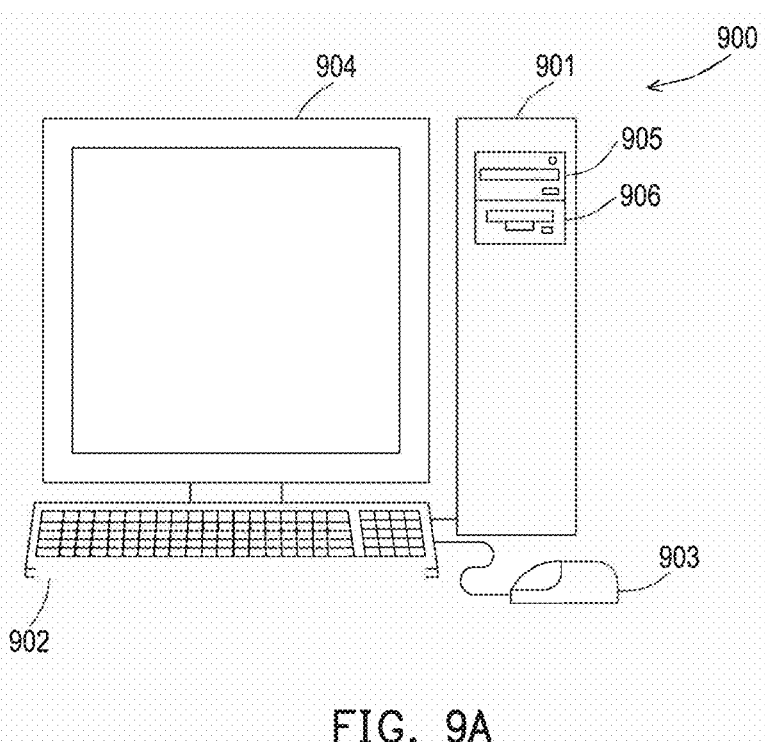
FIG. 9A and FIG. 9B are diagrams of a controller in accordance with some embodiments.
Figure 9B:
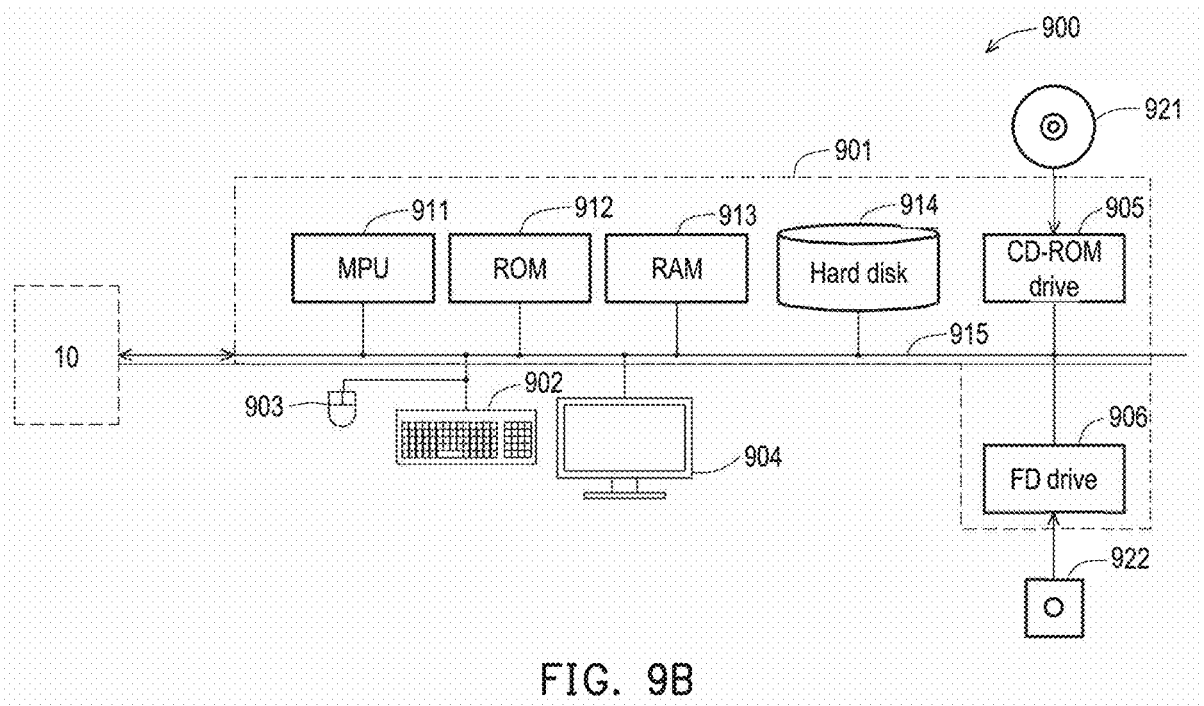

FIG. 9A and FIG. 9B illustrate a computer system 900 for controlling the system 10 and its components in accordance with various embodiments of the present disclosure as described in the foregoing. FIG. 9A is a schematic view of a computer system 900 that controls the system 10 of FIG. 1 in various embodiments. As shown in FIG. 9A, the computer system 900 is provided with a computer 901 including an optical disk read only memory (e.g., CD-ROM or DVD-ROM) drive 905 and a magnetic disk drive 906, a keyboard 902, a mouse 903 (or other similar user input device), and a monitor 904 for presenting information visually.

FIG. 9B is a diagram showing an internal configuration of the computer system 900. In various embodiments, the computer 901 is provided with, in addition to the optical disk drive 905 and the magnetic disk drive 906, one or more processors 911, such as a micro-processor unit (MPU) or a central processing unit (CPU); a read-only memory (ROM) 912, in which a program such as a boot up program is stored; a random access memory (RAM) 913 that is connected to the processors 911 and in which a command of an application program is temporarily stored, and a temporary electronic storage area is provided; a hard disk 914 in which an application program, an operating system program and system data are stored; and a data communication bus 915 that connects the processors 911, the ROM 912, any computer networks and the like. In various embodiments, the computer 901 includes a network card (not shown) for providing a connection to a computer network such as a local area network (LAN), wide area network (WAN) or any other useful computer network for communicating data used by the computer system 900 and the system 10. In various embodiments, the computer system 900 communicates via wireless or hardwired connection to the system 10 and its components.

The program for causing the computer system 900 to execute the process for controlling the system 10 of FIG. 1, and components thereof, according to the embodiments disclosed herein are stored in an optical disk 921 or a magnetic disk 922, which is inserted into the optical disk drive 905 or the magnetic disk drive 906, and then transmitted to the hard disk 914 in various embodiments. Alternatively, the program is transmitted via a network (not shown) to the computer system 900 and stored by the hard disk 914. At the time of execution, the program is loaded into the RAM 913. The program is loaded from the optical disk 921 or the magnetic disk 922, or directly from a network in various embodiments.

The stored programs do not necessarily have to include, for example, an operating system (OS) or a third-party program to cause the computer 901 to execute the methods disclosed herein. The program only includes a command portion to call an appropriate function (module) in a controlled mode and obtain desired results in some embodiments. In various embodiments described herein, the controller 900 is in communication with and coupled to the lithography system 10 to control various functions thereof. The controller 900 is configured to provide control data to those system components and receive process and/or status data from those system components. For example, the controller 900 comprises a microprocessor, a memory (e.g., volatile or non-volatile memory), and a digital I/O port capable of generating control voltages sufficient to communicate and activate inputs to the processing system 100, as well as monitor outputs from the system 10. In addition, a program stored in the memory is utilized to control the aforementioned components of the system 10 according to a process recipe. Furthermore, the controller 900 is configured to analyze the process and/or status data, to compare the process and/or status data with target process and/or status data, and to use the comparison to change a process and/or control a system component. In addition, the controller 900 is configured to analyze the process and/or status data, to compare the process and/or status data with historical process and/or status data, and to use the comparison to predict, prevent, and/or declare a fault or alarm.

As demonstrated in the foregoing, use of integrated multi-faceted inspection coupons results in greater throughput of semiconductor manufacturing processes, and increased revenue generation as well as realized maintenance savings over time. Such quality control measures solve, in particular, the yttria particle/defect problems often encountered in semiconductor manufacturing devices using plasma in extreme environments.

According to various embodiments, an integrated inspection coupon for providing a plurality of certificates of analysis includes a material having a pair of opposing faces and a sidewall continuously disposed between the pair of opposing faces along the edges thereof, and the sidewall comprising a first section that is curved to match a first curvature of a first surface of a coated component that is subject to quality assurance inspection with at least a second section that is curved to match a second curvature of a second surface of the coated component. In some embodiments, the sidewall comprises a plurality of additional sections, each of which matching one of a plurality of additional curvatures of the coated component. In some embodiments, at least one of the first curvature and the second curvature comprise a concave curvature. In some embodiments, the concave curvatures are disposed along lengths of the sidewall. In various instances, a concave curvature has a radius between 0.1 and 100 millimeters. In some embodiments, at least one of the first curvature and the second curvature comprise a concave curvature. In various instances, concave curvatures are disposed at a corner of two lengths of the sidewall. In some instances, the concave curvature has a radius between 0.1 and 100 millimeters. In some embodiments, the material comprises at least one of a metal and a alloy and has a roughness between 2 and 12 micrometers. In some embodiments, the material is coated on at least one opposing face and the sidewall with a coating comprising at least one of a metal oxide, a fluoride, a nitride and a carbide. In some embodiments, the coating comprises a porosity of between 0.1% and 10%, a hardness between 100 Hv and 1000 Hv, and a thickness between 0.001 micrometers and 500 micrometers. In some embodiments, a width of the faces is between 10 millimeters and 200 millimeters. In some embodiments, a length of the faces is between 10 millimeters and 200 millimeters. In some embodiments, a height of the sidewall is between 10 millimeters and 200 millimeters. In various instances, the integrated coupon is at least one of solid and hollow and the opposing faces are one of flat and arced.

According to various embodiments, a method for manufacturing an integrated inspection coupon includes (i) measuring various curvatures on a surface of a component to be spray-coated; (ii) mapping each of the curvatures to a separate section of a sidewall of a multifaceted inspection coupon; (iii) cutting a sheet of a material to form at least one multifaceted inspection coupon having various matching curvatures formed in separate sections of the sidewall; and (iv) coating the sidewall and intervening faces of the multifaceted inspection coupon with at least one of a metal oxide, a fluoride, a nitride and a carbide. In some embodiments, the method further includes mapping concave curvatures from the plurality of curvatures exclusively to separate corners of the multifaceted inspection coupon. In some embodiments, the method further includes mapping convex curvatures from the plurality of curvatures exclusively to separate sections of lengthwise and widthwise sides of the multifaceted inspection coupon. In various instances, a ratio of the radii of the concave curvatures to the convex curvatures is between 0.8 and 1.2.

According to various embodiments, a method for certifying a quality of a spray-coated component includes (i) coating at least one face and an entirety of a multi-curved sidewall of a single inspection coupon with a metal oxide coating using a process and lot used to spray coat a plasma chamber component; (ii) analyzing the coating on the faces and the multi-curved sidewall with an electromagnetic spectrum analysis instrument; and (iii) providing multiple certificates of analysis (CoA) for the plasma chamber component based on the analyzing of the coating of the single inspection coupon.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a multifaceted integrated inspection coupon, comprising:

measuring a plurality of curvatures on a surface of a component to be spray-coated of a crucible of an extreme ultraviolet (EUV) radiation source apparatus;

mapping each of the plurality of curvatures to a separate section of a sidewall of a multifaceted inspection coupon;

cutting a sheet of a material to form at least one instance of the multifaceted inspection coupon with the plurality of curvatures formed in separate sections of the sidewall; and coating the sidewall and intervening faces of the multifaceted inspection coupon with at least one of a metal oxide, a fluoride, a nitride, and a carbide.

2. The method of claim 1, wherein mapping each of the plurality of curvatures to the separate section of the sidewall of the multifaceted inspection coupon comprises mapping concave curvatures from the plurality of curvatures to positions between corners of the multifaceted inspection coupon.

3. The method of claim 2, wherein mapping each of the plurality of curvatures to the separate section of the sidewall of the multifaceted inspection coupon further comprises mapping convex curvatures from the plurality of curvatures to positions between sections of lengthwise and widthwise sides of the multifaceted inspection coupon.

4. The method of claim 3, wherein a ratio of radii of the concave curvatures to the convex curvatures is between 0.8 and 1.2.

5. A method for manufacturing an integrated inspection coupon, comprising:

measuring a plurality of curvatures on a surface of a component to be spray-coated of a crucible of an extreme ultraviolet (EUV) radiation source apparatus;

mapping each of the plurality of curvatures to a separate section of a sidewall of an inspection coupon;

cutting a sheet of a material to form at least one instance of the inspection coupon with the plurality of curvatures formed in separate sections of the sidewall; and coating the sidewall and intervening faces of the inspection coupon with a protective layer.

6. The method of claim 5, wherein mapping each of the plurality of curvatures to the separate section of the sidewall of the integrated inspection coupon comprises mapping concave curvatures from the plurality of curvatures to positions between corners of the inspection coupon.

7. The method of claim 6, wherein mapping each of the plurality of curvatures to the separate section of the sidewall of the integrated inspection coupon further comprises mapping convex curvatures from the plurality of curvatures to positions between sections of lengthwise and widthwise sides of the inspection coupon.

8. The method of claim 7, wherein:

a ratio of radii of the concave curvatures to the convex curvatures is between 0.8 and 1.2, the concave curvatures have a radius between 0.1 and 100 millimeters, and the concave curvatures have a radius between 0.1 and 100 millimeters.

9. The method of claim 7, wherein the protective layer includes at least one of a metal oxide, a fluoride, a nitride, and a carbide.

10. A method for manufacturing an integrated inspection coupon apparatus, comprising:

providing a material having a pair of opposing faces and a sidewall located continuously between the pair of opposing faces along edges of the pair of opposing faces; and matching a first section of the sidewall to a first curvature of a first surface of a coated component of a crucible of an extreme ultraviolet (EUV) radiation source apparatus and matching a second section of the sidewall to a second curvature of a second surface of the coated component of the crucible of the extreme ultraviolet (EUV) radiation source apparatus.

11. The method of claim 10, further comprising matching each of a plurality of additional sections of the sidewall to one of a plurality of additional curvatures of the coated component of the crucible of the extreme ultraviolet (EUV) radiation source apparatus.

12. The method of claim 10, wherein at least one of the first curvature and the second curvature comprises a concave curvature.

13. The method of claim 12, wherein the concave curvature of the at least one of the first curvature and the second curvature is positioned along a length of the sidewall.

14. The method of claim 12, wherein the concave curvature has a radius between 0.1 and 100 millimeters.

15. The method of claim 10, wherein at least one of the first curvature and the second curvature comprises a convex curvature.

16. The method of claim 15, wherein the convex curvature is positioned at a corner of two sides of the sidewall.

17. The method of claim 15, wherein the convex curvature has a radius between 0.1 and 100 millimeters.

18. The method of claim 10, wherein the material comprises at least one of a metal and an alloy and has a surface roughness between 2 and 12 micrometers.

19. The method of claim 10, further comprising coating the material on the pair of opposing faces and the sidewall with a coating including at least one of a metal oxide, a fluoride, a nitride, and a carbide.

20. The method of claim 10, wherein:

a width of the pair of opposing faces is between 10 millimeters and 200 millimeters, and a length of the pair of opposing faces is between 10 millimeters and 200 millimeters.

* * * * *